United States Patent [19]

Fong

[11] Patent Number: 5,319,323
[45] Date of Patent: Jun. 7, 1994

[54] POWER SUPPLY COMPENSATED MOS SCHMITT TRIGGER OSCILLATOR

[75] Inventor: Vincent L. Fong, Fremont, Calif.

[73] Assignee: Hyundai Electronics America, San Jose, Calif.

[21] Appl. No.: 933,261

[22] Filed: Aug. 19, 1992

[51] Int. Cl.⁵ ........................................... H03K 3/354
[52] U.S. Cl. .................................. 331/111; 331/143; 331/179
[58] Field of Search ..................... 331/111, 143, 179

[56] References Cited

U.S. PATENT DOCUMENTS 4,689,581  8/1987  Talbot ........................... 331/111 X
4,742,315  5/1988  Schreilechner ................ 331/111 X
4,758,801  7/1988  Drexelmayr .................... 331/8

Primary Examiner—Siegfried H. Grimm
Attorney, Agent, or Firm—Townsend and Townsend Khourie and Crew

[57] ABSTRACT

An MOS oscillator circuit which is relatively immune to power variations in the supply is presented. A capacitor is charged and discharged in responsive to the feedback signal from a Schmitt trigger circuit. The current to charge and discharge the capacitor is generated by a current mirror which is regulated by a constant voltage generator for immunity from power supply variations.

4 Claims, 2 Drawing Sheets

POWER SUPPLY COMPENSATED MOS SCHMITT TRIGGER OSCILLATOR

BACKGROUND OF THE INVENTION

Oscillator circuits are widely used in integrated circuits to accomplish various tasks, such as the generation of internal voltage references, charge pumping and other functions. A very commonly used MOS oscillator circuits is a ring oscillator which has an odd number of inverter stages connected in a positive feedback loop, as shown in FIG. 1. This circuit operates by the switching of each inverter from one logic state to another. Assuming initially that the output terminal, which had been at logic 1, switches to logic 0, then by the feedback loop, the output node of the first inverter switches from 0 to 1.

The switch from 0 to 1 at that output node occurs after an RC time constant, R being the resistive load at the output node and C being the capacitance at that node. Similarly, the output node of the second inverter switches from 1 to 0 logic states after the designed RC time constant. Therefore, after the sum of all of the RC time constants of the stages, typically 50–100 stages, the output terminal changes state from 0 to 1 again. This switches the first inverter again and this circuit switches back and forth so that at any one node, the logic state oscillates between 1 and 0.

A major drawback of this type of circuit is that it is highly dependent on the stability of the power supply to the oscillator circuit and minimal process variations used in forming the integrated circuit elements of the oscillator circuit. For example, a variation in the positive voltage supply, $V_{CC}$, from +4.5 volts to +5.5 volts may cause the period of oscillation to vary as much as 100%. This is not acceptable for most applications.

On the other hand, the present invention provides for a MOS oscillator circuit which is substantially independent of power supply variations. Furthermore, the oscillator circuit uses typical MOS process device elements so that no variation in a MOS semiconductor process is required to manufacture the oscillator circuit.

SUMMARY OF THE INVENTION

The present invention provides for a MOS oscillator circuit connected between first and second power supplies. The oscillator circuit has a current mirror block connected to the first and second power supplies for generating two reference currents. A switch having a control terminal connects a capacitor to the current mirror block such that the capacitor alternately is charged and discharged by the two reference currents respectively responsive to a signal on the control terminal. A Schmitt trigger has an input terminal connected to said capacitor and an output terminal connected in a feedback fashion to the control terminal whereby an oscillating signal is generated at the output terminal substantially independent of variations in the voltage supplies.

A reference voltage block also provides for a reference voltage which is substantially independent of power supply variations for the current mirror block to generate the reference currents.

DETAILED DESCRIPTION OF THE PREFERRED EMBODIMENT(S)

Figure 1:
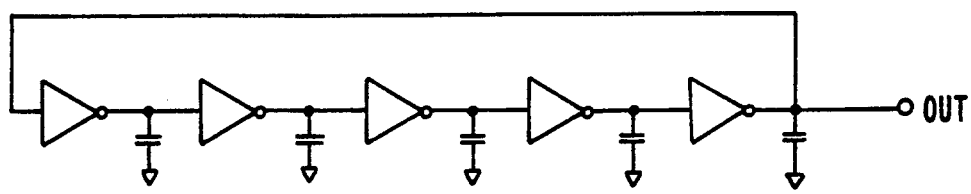
FIG. 1 is a ring oscillator of the prior art.
Figure 2:
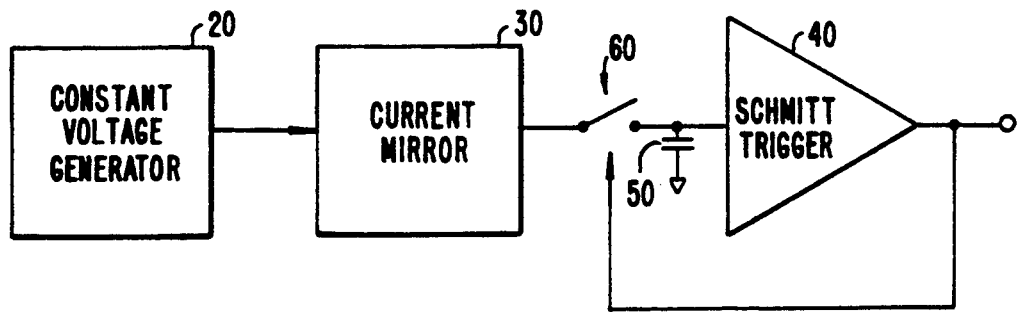
FIG. 2 is a block diagram of an MOS oscillator circuit according to the present invention.

FIG. 2 is a block diagram which illustrates the general organization of a MOS oscillator circuit according to the present invention. A block 20 generates a constant voltage to compensate for fluctuations in the power supply voltages. The constant voltage from the block 20 is used to generate a constant current in a current mirror block 30. This constant current from the block 30 is used to charge or discharge a capacitor element 50. The charging and discharging operation is feedback-controlled by a switch 60 which acts in response to the output of a Schmitt trigger circuit 40. The capacitor element 50 is connected to the input to the Schmitt trigger block 40.

In operation, the capacitor element 50 is charged by a constant current from the block 30 through the switch 60. Likewise, the capacitor element 50 is discharged by a constant current from the block 30. The charging and discharging of the capacitor element 50 is under control of the switch 60 acting in response to the output of the Schmitt trigger circuit 40. The switch 60 operates to alternately charge and discharge the capacitor element 50 through the current mirror block 30. In this manner, the output of the Schmitt trigger itself generates a precise oscillating signal whose period is substantially independent of variations in the power supply. Furthermore, as described below, standard MOS devices are used so that variations in any particular MOS semiconductor processes not required.

Figure 3:
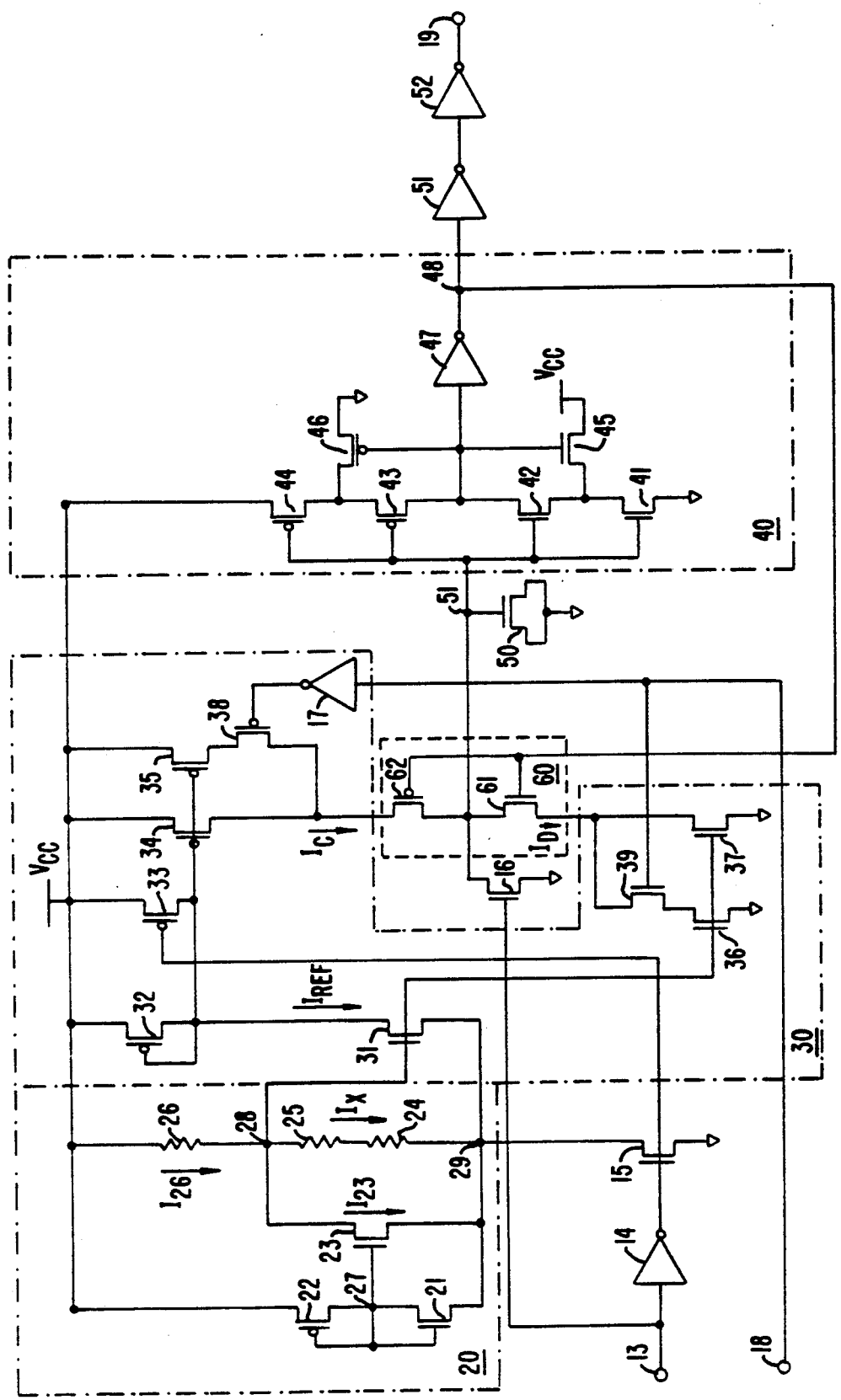
FIG. 3 is a detailed schematic diagram of the oscillator circuit according to one embodiment of the present invention.

FIG. 3 is a detailed circuit diagram of one embodiment of the present invention. The oscillator circuit has two control terminals 13 and 18 for respectively enabling the operation of the circuit and for increasing the oscillation frequency of this circuit once the circuit is enabled. This is explained below.

The reference voltage generator block 20 has two voltage divider networks. The first network is formed by an NMOS transistor 21 which has its source connected to the drain of an enabling transistor 15. Also in the first network is a PMOS transistor 22 which has its drain connected to the drain of NMOS transistor 21. The source of the PMOS transistor 22 is connected to the more positive of the two voltage supplies, at $V_{CC}$. The gates of the transistors 21 and 22 are connected to a common node found by the drains of the transistors 21 and 22 so that the transistors are each connected in diode configuration.

The second network is formed by three serially connected resistors 24–26, between the positive power supply and the drain of the enabling transistor 15. Between the resistors 24–25 and the resistor 26 is a node 28 which is connected to a drain of a shunt transistor 23, an NMOS transistor, connected in parallel with the resistors 24 and 25. The source of the transistor 23 is also connected to the drain of the NMOS transistor 15 at the node 29. The gate of the shunt transistor 23, in common with the gates of the transistors 21 and 23 of the first network, is connected to the node formed between the drains of the transistors 21 and 23.

The MOS oscillator circuit is enabled by a logic low, or 0, signal on the control terminal 13. The signal is inverted to turn on the MOS transistor 15. The drain of the transistor 15, the node 29, is then substantially at the voltage of the second power supply, the lower of the two power supplies, at ground. Voltages are generated at the nodes 27 and 28 from each of the divider networks respectively. Both of these node voltages increase with an increase in the positive power supply, $V_{CC}$. With an increase in the power supply voltage, the voltages on the gate (node 27) and the drain (node 28) of the shunt transistor 23 increase. Therefore the current through the transistor 23 also increases. The MOS transistor 23 is designed so that the current increase through the transistor 23 is equal to the current increase through the resistor 26 as $V_{CC}$ rises. Since the NMOS transistor 23 shunts the increased current through the resistor 26, a constant current flows through the resistors 24 and 25. Thus, since the current through the two resistors 24 and 25 is constant despite of variations in the power supply, the voltage at the node 28 is constant with respect to the node 29, which is substantially at ground. Thus, a constant voltage at the node 28 is generated.

Note that this voltage is also substantially temperature-compensated since both resistor and transistor currents have negative temperature coefficients. Thus, the currents in both networks track in the same way with respect to variations in temperature.

The constant voltage from the block 20 is used to generate constant currents in the current mirror block 30. The block 30 has an input transistor 31 which has its source connected to the node 29 and its gate connected to the node 28 of the block 20. The drain of the NMOS transistor 31 is connected to a PMOS transistor 32, which is connected in a diode configuration. The PMOS transistor 32 has its source connected to the positive power supply and has its gate and drain commonly connected to the drain of a PMOS transistor 33 and the gates of PMOS transistors 34 and 35. The sources of the PMOS transistors 33-35 are connected to the positive power supply. The drains of the PMOS transistors 34 and 35 are connected to the switch 60, in the form of two transistors, a PMOS transistor 62 and NMOS transistor 61, which controls the charging and discharging operation of the capacitive element 50.

Also, in the current mirror block 30 are NMOS transistors 36 and 37 which have their gates connected to the gate of the input transistor 31. The NMOS transistors 36 and 7 have their sources connected to the second power supply at ground and their drains connected to the switch 60 formed by the transistors 61 and 62.

The input transistor 31 has its gate connected to the node 28 and its source connected to the node 29, so that the $V_{GS}$ for the transistor 31 is constant. A constant current $I_{ref}$ is created through the transistor 31 and the serially connected transistor 32. The PMOS transistor 34 (and PMOS transistor 35) are connected in a current mirror configuration in respect to the PMOS transistor 32. Thus, reference currents are also generated through the PMOS transistors 34 and 35. Similarly, since the node 29 is substantially at ground, the 35 NMOS transistor 37 (and the NMOS transistor 36) are current mirrors of the transistor 31. Thus, reference currents are generated in the NMOS transistors 37 and 36. These reference currents, $I_C$ and $I_D$, respectively charge and discharge the capacitive element 50 by the operation of the two switching transistors 61 and 62.

The two transistors 61 and 62 have their drains commonly connected to a gate of the capacitor element 50 in the form of a capacitor-configured transistor having both source and drain connected to ground. The source of the PMOS transistor 62 is connected to the drain of the PMOS transistor 34 and the drain of the PMOS transistor 35 through a PMOS transistor 38. The source of the NMOS transistor 61 is connected to the drain of the NMOS transistor 37 and the drain of the NMOS transistor 36 through an NMOS transistor 39.

The gate of the capacitor-configured transistor 50 is also connected to the input node 51 of the Schmitt trigger circuit 40. The transistors 41-46 of the Schmitt trigger circuit 40 are in a typical configuration of such a circuit. The transistors 41-44 are serially connected between the positive power supply and ground. The NMOS transistor 41 has its source connected to ground with its drain connected to the source of the NMOS transistor 42 which, in turn, has its drain connected to the drain of the PMOS transistor 43. The PMOS transistor 43 has its source connected to the drain of the PMOS transistor 44 which has its source connected to the positive power supply at $V_{CC}$. The gates of all four transistors 41-44 connected to the input node 51 of the Schmitt trigger circuit 40 and to the gate of the capacitor element 50. An NMOS transistor 45 has a source connected to the drain of the NMOS transistor 41 and the source of the NMOS transistor 42, while its drain is connected to the power supply voltage at $V_{CC}$. A PMOS transistor 46 has its source connected to the drain and source of the PMOS transistors 44 and 43 respectively. The drain of the PMOS transistor 46 is connected to ground. The gates of the NMOS transistor 45 and PMOS transistor 46 are connected in common to the output node of the Schmitt trigger formed by the drains of the NMOS transistors 42 and the PMOS transistor 43.

The remainder of the circuit 40 is an inverter 47 with properly sized transistors to effectively invert the polarity of the switching signal from the common drain of the transistors 42 and 43. From the output node 48 of the circuit 40, two more serially connected inverters 51 and 52 provide a further buffer for the output signal at the terminal 19.

As expected for a Schmitt trigger circuit, the circuit precisely switches at an input trip voltage V1, as the input signal rises from logic 0 to logic 1 and at V2, as the input voltage falls from logic 1 to logic 0. The relationship between the trip voltages, V1 and V2, is given by $$V1 = (1/C_{50}) \cdot I_C \cdot T1$$

$$V2 = (1/C_{50}) \cdot I_D \cdot T2$$

Where T2 is the time taken to charge the capacitor element 50 from V1 to V2, and T1 is the time taken to discharge the capacitor C50 from V2 to V1. Since the referenced currents $I_C$ and $I_D$ are fixed together with the capacitance of the element 50, T1 and T2 are fixed also. The Schmitt trigger circuit 40 switches with a precise period.

Figure 4:
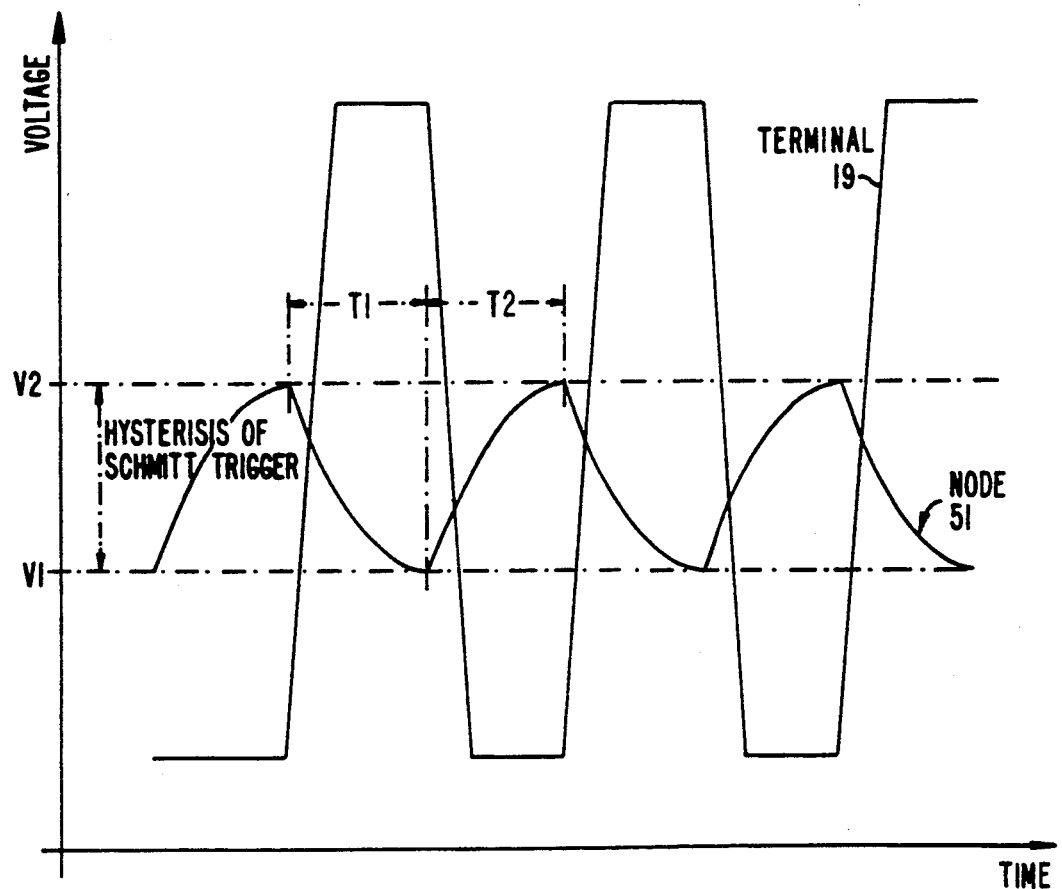
FIG. 4 is a timing diagram illustrating the signals at the various nodes of the circuit shown in FIG. 3.

FIG. 4 shows the timing of the signals at the various nodes of the oscillator circuit. After T2 time, the capacitor 50 is charged up to cause the Schmitt trigger circuit 40 to change its output from logic 0 to logic 1. This turns on the transistor 61 and turns off the transistor 62. The node 51 falls toward V1 where the node 48 switches from logic 1 to logic 0 after T2 time. The capacitor element is discharged by the current $I_D$. This turns on the switching transistor 62 so that the capacitor 50 is charged by current $I_C$ after T1 time. The output node 48 of the Schmitt trigger changes from logic 1 to logic 0 and the oscillating cycle continues. Note that while $I_C$ and $I_D$ have been designated as having different magnitudes, typically the current magnitudes are equal.

With the small number of inverters in the described circuit, the period of oscillation is relatively immune to variations in the power supply. Furthermore, the oscillator circuit occupies less space on an integrated circuit than a conventional ring oscillator of 50 to 100 stages.

As pointed out previously, the control terminal 13 provides for enabling and disabling function for the oscillator circuit. With a logic 1, or high, signal on the terminal 13, the oscillator circuit is disabled. The node 29 of the block 20 is decoupled from the ground and the input node 51 of the Schmitt trigger is grounded. A logic 20 signal enables the oscillator circuit.

The control terminal 18 provides for an increase in the oscillating frequency of the oscillator circuit. The terminal 18 is connected to the gates of the PMOS transistor 38 (through an inverter 17) and NMOS transistor 39. With a logic 1 signal on the terminal 18, both transistors 38 and 39 are turned on. This provides for an additional current source by the PMOS transistor 35 for the reference current $I_C$ and an additional current sink by the NMOS transistor 36 for the reference current $I_D$. Depending upon the sizes of the transistors 35 and 36 (and 38 and 39), the reference currents $I_C$ and $I_D$ are increased by selected amounts. T1 and T2 are shortened by these amounts.

While the above is a complete description of the preferred embodiments of the invention, various alternatives, modifications and equivalents may be used. It should be evident that the present invention is equally applicable by making appropriate modifications to the embodiments described above. Therefore, the above description should not be taken as limiting the scope of the invention which is defined by the metes and bounds of the appended claims.

What is claimed is:

1. A MOS oscillator circuit connected between first and second power supplies, said oscillator circuit comprising means connected to said first and second power supplies for generating a reference voltage;

first and second MOS transistors, each transistor having first and second source/drain terminals and a gate, said first MOS transistor having a first source/drain terminal connected to said first power supply, said second MOS transistor having a first source/drain terminal connected to said second power supply and a second source/drain terminal connected to a second source/drain terminal of said first MOS transistor, a gate of one of said MOS transistors connected to said reference voltage generating means, a gate of the other of said MOS transistors connected to its drain; and a third MOS transistor having a first source/drain terminal connected to said first power supply, a gate connected to said gate of said first MOS transistor, and a second source/drain terminal forming a first output node to provide a first reference current source; and a fourth MOS transistor having a first source/drain terminal connected to said second power supply, a gate connected to said gate of said second MOS transistor and a second source/drain terminal forming a second output node to provide a second reference current sink, capacitive means;

switching means, having a control node, for connecting said capacitive means to said first reference current source and second reference current sink such that said capacitive means alternately is charged and discharged by said two reference currents respectively responsive to a signal on said control node; and a Schmitt trigger having an input terminal connected to said capacitive means and an output terminal connected to said control terminal;

whereby an oscillating signal is generated at said output terminal substantially independent of variations in said voltage supplies.

2. A MOS oscillator circuit as in claim 1, wherein said first and third MOS transistors comprise PMOS transistors, and said second and fourth MOS transistors comprise NMOS transistors.

3. A MOS oscillator circuit as in claim 1 further comprising a fifth MOS transistor having a first source/drain terminal connected to said first power supply, a gate connected to said gate of said first MOS transistor, and a second source/drain terminal connected to said first output node through a first coupling transistor, said first coupling transistor responsive to a signal on a control terminal, whereby said fifth MOS transistor provides an increased first reference current source responsive to said control terminal signal to increase the frequency of said oscillating signal.

4. A MOS oscillator circuit as in claim 1 further comprising a sixth MOS transistor having a first source/drain terminal connected to said second power supply, a gate connected to said gate of said second MOS transistor and a second source/drain terminal connected to said second output node through a second coupling transistor, said second coupling transistor responsive to a signal on a control terminal, whereby said sixth MOS transistor provides an increased second reference current sink responsive to said control terminal signal to increase the frequency of said oscillating signal.

* * * * *